United States Patent [19]
Sprenkle

[11] Patent Number: 4,521,959
[45] Date of Patent: Jun. 11, 1985

[54] DEVICE FOR THE CONTROLLED EXTRACTION OF ELECTRONIC CIRCUIT COMPONENTS

[75] Inventor: George J. Sprenkle, Phoenixville, Pa.

[73] Assignee: Burroughs Corporation, Detroit, Mich.

[21] Appl. No.: 510,754

[22] Filed: Jul. 5, 1983

[51] Int. Cl.³ .............................................. H05K 13/04
[52] U.S. Cl. ....................................... 29/741; 29/758; 29/764
[58] Field of Search ................. 29/278, 626, 741, 758, 29/762, 764

[56] References Cited
U.S. PATENT DOCUMENTS 3,699,629 10/1972 Hood, Jr. et al. ..................... 29/764

Primary Examiner—Howard N. Goldberg
Assistant Examiner—Timothy V. Eley
Attorney, Agent, or Firm—F. A. Varallo; M. L. Young; K. R. Peterson

[57] ABSTRACT

The present invention describes an extraction device for removing components, such as leaded integrated circuit packages, from a printed circuit board to which their leads are soldered. The device, under operator control, is designed to captivate the component and to apply to it an extraction force which has a predetermined magnitude independent of the operator's judgment. Accordingly, when all of the component solder joints at the printed circuit board have been sufficiently reflowed, the device automatically withdraws the component from the board into itself. Damage to the board or the component as a result of the extraction process is virtually eliminated through the use of the device.

10 Claims, 4 Drawing Figures

DEVICE FOR THE CONTROLLED EXTRACTION OF ELECTRONIC CIRCUIT COMPONENTS

BACKGROUND OF THE INVENTION

Component extraction devices presently utilized in the electronics field are generally of a simple nature. As applied to the removal of multi-leaded integrated circuit packages which have been soldered to a printed circuit board, they are a pliers-like tool. An operator uses the latter to grip the component and to manually exert a force thereon directed away from the board, as the lead solder connections are heated to reflow the solder. The critical part of the removal process is the precise time when the extraction should take place. This time is a variable, depending for example, on the number of leads and the solder joint strengths. Moreover, when the solder joints of a multiplicity of leads are reflowed simultaneously, some joints may require a longer heat exposure because of the heat-sink properties of the copper planes within a multi-layer board to which the corresponding leads are attached. If an operator manually attempts to extract a component before all of the solder joints are sufficiently reflowed, damage can occur to both the printed circuit board and the component. In the former, the plated hole sleeves may be torn from the board rendering it unusable or in the latter, the component leads may be broken. On the other hand, the application of high temperatures to the board and the component for too long a period of time during extraction is inefficient from the standpoint of time loss and is deleterious to both the board and the component.

What is required is an extraction tool in which the extraction force provided thereby is not based upon operator judgment, but is instead, predetermined within the tool itself. Moreover, the operation of the tool should remain constant with every use, thereby eliminating the possibility of damage attendant with the application of manual extraction forces. The device of the present invention fills such a need.

SUMMARY OF THE INVENTION

In accordance with the present invention, a tool is provided which although manually attached to the component to be extracted, requires no operator judgment for its removal. The removal process is controlled by a predetermined spring load to extract the component, which load is predicated in turn, on such criteria as the number of leads on the component, the lead strength and the solder joint strength.

With reference to an actual operative embodiment of the invention, the extraction tool is comprised of an assembly of two basic parts, namely, an elongated body member of rectangular cross section and a plunger-like shaft, spring-loaded by a coaxial coil spring, and slidably disposed within a central aperture of said body member. A pair of substantially planar side plates are immovably affixed to the extremities of respective opposite sides of said body member and project therebeyond. Each of the plates includes at its "free" extremity, a pair of narrow foot-like extensions, such that the assembled tool extremity comprises four extensions which describe the corners of a rectangle substantially the same physical size as the component to be extracted.

Several members are attached to the aforementioned shaft. One of these is a generally "H" shaped support member which is contained between the aforementioned side plates and is slidably movable therebetween in response to the movement of the shaft. A pair of gripper members are pivotally attached to respective opposite sides of said support member within the legs of the "H". Each gripper member has along an extremity thereof, a jaw-like section for engaging opposite sides of the component to be extracted. The gripper members include spring means for tending to bias the jaw-like sections to a "closed" condition.

A second member slidably coupled to the farthest extremity of the shaft is a spring-loaded pressure/ejection plate disposed within the rectangular cavity in the tool formed by the side plates attached to the body member and the gripper members. Movement of the shaft in the direction of the four foot-like extensions, causes the pressure/ejection plate to force open the jaws of the gripper plates.

The shaft includes a pin radially disposed therein to serve as a detent. When the shaft is moved forward, compressing its coaxial spring, the pin which normally resides in a narrow slot in the body member exits the latter. Rotation of the shaft at this time, approximately 90°, causes the pin to contact the surface of the body member, and to retain the shaft in a loaded condition, thereby presetting the tool.

In use, the operator places the tool in its preset state in the manner described hereinbefore. The jaws of the gripper members are open by virtue of the operation of the spring-loaded pressure/ejection plate. The operator places the tool over the component to be extracted, such that its foot-like extensions straddle the latter. Contact of the upper surface of the component itself, or of a heat sink member attached to the surface thereof, with the pressure/ejection plate causes the latter to release the jaws of the gripper members permitting them to close upon opposed edges of the component.

Next, the operator turns the tool shaft approximately 90 degrees, permitting the detent pin to reenter the slot in the body member. A force of predetermined magnitude provided by the coaxial spring is now applied to the component. Upon sufficient reflow of the solder joints which hold the component leads to the printed circuit board, the tool will automatically withdraw the component into itself. The succeeding preset operation, causes the pressure/ejection plate to open the jaws and to push the component out of the tool.

The present invention provides a highly effective, reliable tool which overcomes the problems of hand operated extraction. The tool provides a controlled, consistent operation and virtually eliminates damage to either the component or the interconnection medium to which its leads are soldered. The fact that the extraction takes place in a "hands-off" mode is a significantly advantageous feature. Other features and advantages of the invention will become more fully apparent in the detailed description of the tool and its mode of operation which follow.

DESCRIPTION OF THE PREFERRED EMBODIMENT

Figure 1:
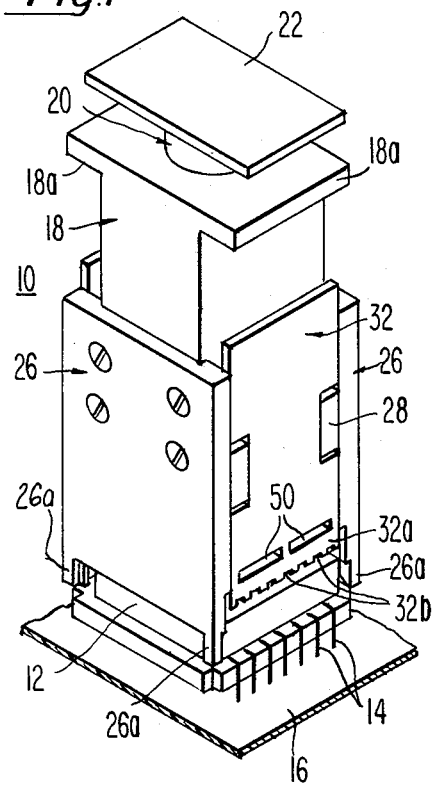
FIG. 1 is a pictorial view of the extraction tool of the present invention shown in relation to an electronic component mounted on a printed circuit board.

A pictorial view of the extraction device 10 of the present invention poised above an electronic component 12 having leads 14 attached to a printed circuit board 16, appear in FIG. 1. The internal device structure is apparent in the side view of FIGS. 2 and 3, while FIG. 4 provides additional insight into several internal members.

Figure 3:
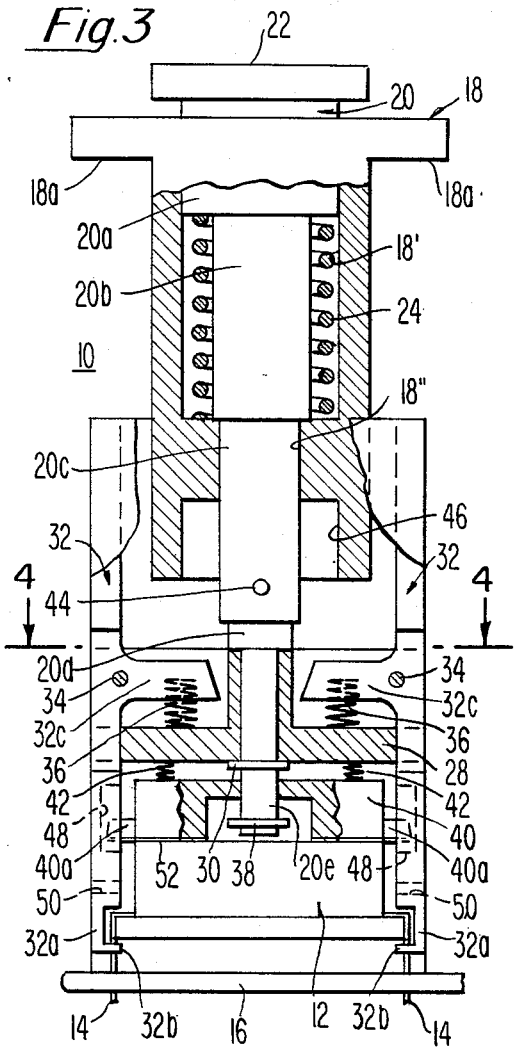
FIG. 3 is a side view with portions broken away of the present extraction tool illustrated after contact with the component and prior to operator actuation of its extraction force.
Figure 2:
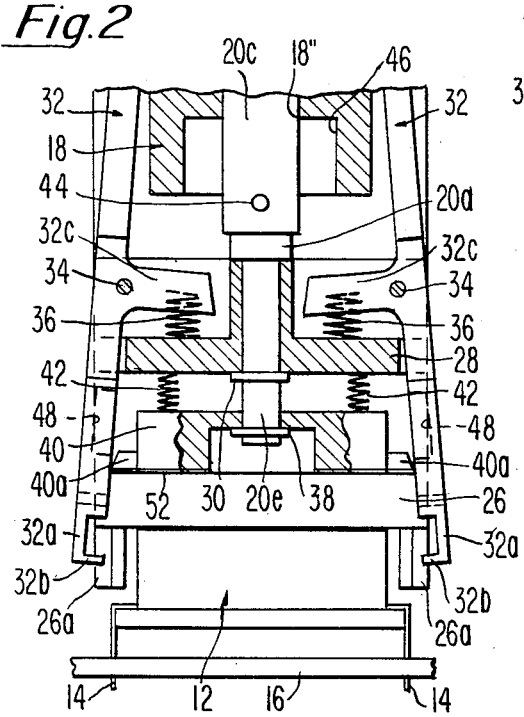
FIG. 2 is a partial side view with portions broken away, of the extraction tool, the latter being in an operator-initiated, preset state prior to contact with the component.
Figure 4:
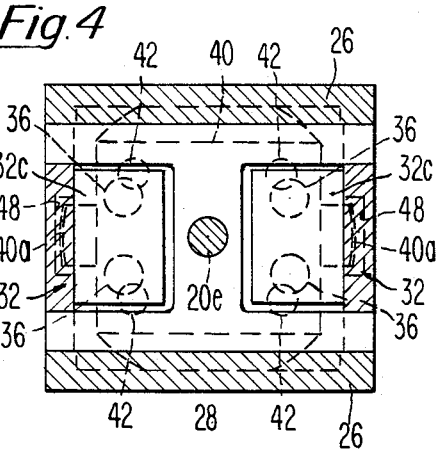
FIG. 4 is a section view taken along the lines 4—4 of FIG. 3 to better illustrate the internal structure of the extraction tool.

With general reference to FIGS. 1 through 3, the extraction tool 10 is comprised of an assembly of two basic parts, namely, an elongated body member 18 of rectangular cross section and a plunger-like cylindrical shaft 20. The outer extremity of the body member includes two relatively thin planar sections 18a extending beyond and at right angles to respective opposite sides thereof. The latter sections cooperate with a rectangular plate 22 affixed to a corresponding extremity of shaft 20, to provide finger holds for operating the device 10.

Body member 18 includes a pair of central contiguous concentric bores 18' and 18''. Shaft 20 is provided with a plurality of contiguous cylindrical sections, 20a through 20e. Shaft sections 20a and 20c are accommodated respectively by bores 18' and 18'' of body member 18. Shaft 20 is spring-loaded during operation by means of a coaxial coil spring member 24 which encloses shaft section 20b.

A pair of substantially planar side plates 26 are immovably affixed to the inner extremities of respective opposite sides of body member 18 and project therebeyond. Each of the plates 26 includes a pair of narrow foot-like extensions 26a.

With continued reference to FIGS. 1 through 3, several members are coupled to shaft 20. One of these is a generally "H" shaped support member 28 (as also seen in plan view in FIG. 4). The support member 28 is mounted on section 20e of shaft 20 where it abuts the shoulder formed by shaft section 20d at one extremity, and a retainer 30 at its other extremity. The support member 28 is disposed between the aforementioned side plates 26 and is slidably movable therebetween in response to the movement of the shaft 20. A pair of component gripper members 32 are pivotally attached by means of pins 34 to respective opposite sides of the support member 28 within the legs of the "H". Each gripper member 32 has, along an extremity thereof, a jaw-like section 32a with a plurality of teeth 32b for engaging opposite sides of the component 12 to be extracted, while avoiding the leads 14 of the latter. Each gripper member 32 includes a centrally disposed tang 32c which accommodates the respective extremities of a pair of springs 36, the opposite extremities of which, rest upon an inner surface of the support member 28. The purpose of springs 36 is to bias the jaw-like sections 32a to a "closed" position with respect to the edges of component 12.

A second member slidably coupled to the farthest extremity of shaft section 20e and held thereon by retainer 38 is a pressure/ejection plate 40. The plate 40 is spring loaded by virtue of springs 42 interposed between adjacent surfaces of the plate 40 and support member 28. As seen in FIG. 2, the compressive force provided by springs 42 is such that movement of the shaft 20 toward component 12 causes the pressure/ejection plate 40 to overcome the gripper members' closing bias provided by springs 36. This action permits the projecting pieces 40a of the plate 40 to bear against the lower portions of the members 32 and to cause the jaw-like sections 32a to assume an "open" position. This is regarded as a preset condition.

Mention has been made of movement of the shaft 20 toward component 12. With reference to FIG. 3, the shaft 20 includes a radially disposed pin 44 which serves as a detent. Thus, when the shaft 20 is moved toward the component 12, compressing spring 24, the pin 44 which normally resides in a narrow slot 46 in the body member 18, exits the latter. Rotation of the shaft 20 at this time, approximately 90°, causes pin 44 to contact the surface at the inner extremity of the body member 18, and the shaft is retained in its loaded preset condition.

With specific continued reference to FIG. 3, while the tool 10 is in its preset condition, contact by the surface of the pressure/ejection plate 40 with the top of the component 12, causes the plate 40 to move upward on the shaft section 20e and to compress springs 42. The projecting pieces 40a of plate 40 are trapped within the shallow depressions 48 in the gripper members 32 and springs 36 again bias the latter to a closed condition, wherein the jaw-like sections 32a enclose the edge of the component 12.

At this point, the lower portion of the jaw-like section 32a is not in intimate contact with the lower surface of the component 12. If the shaft 20 is again rotated 90°, the detent pin 44 reenters slot 46, pulling the jaw-like section 32a into firm contact with the component 12. Spring 24 now provides a predetermined extraction force to the component 12, via the gripper members 32. Assuming that leads 14 of component 12 are soldered to the printed circuit board 16, application of heat to the soldered connections to reflow the latter, will cause the extraction tool 10 to withdraw the component 12 at the precise time when sufficient reflow has occurred. In order to improve the thermal exchange with the solder connections and to minimize the heat sink effect of the metallic tool itself, two elongated apertures 50 are formed in each gripper member 32, just above the jaw-like section 32a. Additionally, a thin coating of thermally insulative material 52 is placed over the extremity of the pressure/ejection plate 40 which contacts the component.

In order to use the tool, as seen in its rest condition in FIG. 1, the operator presses plate 22 on shaft 20 toward the sections 18a of body member 18, compressing spring 24, until plate 22 may be rotated approximately 90°. The tool is now in its preset condition as described hereinbefore. The jaw-like sections 32a are open, as seen in FIG. 2.

The operator then places the tool 10 over the component 12 to be extracted. The four foot-like extensions 26a of the side plates 26 straddle the component 12. It should be noted that the component 12 in FIGS. 1 through 3 is illustrated in diagrammatic fashion. Thus, the component envelope as depicted may, for example, represent a low profile ceramic disk with a heat sink member disposed on its surface, or a high profile encapsulated device. In either case, contact of the uppermost surface of the component itself, or the component assembly, with the lower insulated surface of the pressure/ejection plate 40, and upward movement of the latter, permits the jaw-like sections 32a to close upon opposed edges of the component.

The operator then turns the plate 22 on shaft 20 approximately 90°, permitting the detent pin 44 to reenter slot 46 in the body member 18. The extraction force applied to component 12 is now a function of the compressed coaxial spring 24, and not subject to the operator's judgment.

Upon sufficient reflow of the solder which holds the component leads 14 to the printed circuit board 16, the tool 10 will automatically withdraw the component 12 into itself. When the operator again presets the tool for the next extraction, the pressure/ejection plate 40 pushes the component out of the tool past the open jaw-like sections 32a.

In conclusion, it is submitted that the extraction tool disclosed herein offers a convenient, controlled, nondestructive time-saving means of removing electronic components from the interconnection media to which they are attached. It should be understood that depending upon the particular application, changes and modifications of the tool may be needed. For example, the extraction spring force will be determined by such parameters as the number of leads, the lead strength and the solder joint strengths. Moreover, the dimensions of various parts of the tool, which bear a relation to the geometry of the component to be extracted, must be chosen accordingly. Such variations as are within the skill of the designer, and which do not depart from the true scope and spirit of the invention are intended to be covered by the claims which follow.

What is claimed is:

1. An extraction tool for use in removing an electronic component from an interconnection medium, comprising:

a body member of substantially rectangular cross section and having a central longitudinal aperture therein, a pair of side plates immovably affixed to a respective first pair of opposite sides of said body member and extending longitudinally therebeyond, said side plates being adapted to contact said interconnection medium and to straddle said component, a shaft slidably and rotatably disposed in said aperture of said body member, a coaxial spring member situated in said aperture and enclosing a portion of said shaft, a pair of substantially planar gripper members, means coupling said gripper members to said shaft, said gripper members being disposed adjacent the respective second pair of opposed sides of said body member, said gripper members having respective jaw-like sections at homologous extremities thereof, said jaw-like sections being retracted with respect to opposed edges of said component when said tool is in a rest condition, whereupon the application of an external force to said shaft in the direction of said component is capable of moving said gripper members to an extended preset position and establishing a compressive force in said spring member, means coupled to said shaft for retaining said gripper members in said extended preset position upon the cessation of said external force applied to said shaft, whereby said jaw-like sections are able to engage said opposed edges of said component, and whereupon the subsequent release of the compressive force stored by said spring member acting through said gripper members is capable of applying an extraction force of predetermined magnitude to said component.

2. A tool as defined in claim 1 further including pressure/ejection means coupled to said shaft and disposed in contact with said gripper members, said pressure/ejection means being responsive to the attainment of said extended preset position by said gripper members for causing said jaw-like sections to assume an open condition relative to said opposed edges of said component, said pressure/ejection means being capable of contact with said component whereby said jaw-like sections close upon said opposed edges of said component.

3. An extraction tool for use in removing an electronic component from an interconnection medium to which the component leads are soldered, comprising:

a body member of substantially rectangular cross section and having a central longitudinal aperture therein, said aperture comprising first and second bores of respective different diameters, a pair of side plates immovably affixed to a respective first pair of opposite sides of said body member and extending longitudinally therebeyond, said side plates being adapted to contact said interconnection medium and to straddle said component, a shaft slidably and rotatably disposed in said aperture of said body member, said shaft having a plurality of contiguous coaxial cylindrical sections, at least a first and second shaft section having diameters capable of being accommodated by said first and second bores, a third shaft section interposed between said first and second shaft sections and having a diameter intermediate said last mentioned sections, a coaxial spring member situated in said aperture and encompassing said third shaft section, a pair of substantially planar gripper members, means coupling said gripper members to said shaft, said gripper members being disposed adjacent the respective second pair of opposite sides of said body member, said gripper members having respective jaw-like sections at homologous extremities thereof, said jaw-like sections being displaced a predetermined longitudinal distance from opposed edges of said component when said tool is in a rest condition, whereupon the application of an external force to said shaft is capable of moving said shaft toward said component in opposition to the compressive force of said spring member, said body member including a narrow slot diametrically disposed in relation to said second bore and extending on both sides thereof beyond the circumference of said last mentioned bore, said second shaft section having a detent pin projecting radially from its surface, said detent pin residing in said narrow slot when said tool is in said rest condition and exiting said slot in response to the application of said external force to said shaft, whereupon the concurrent rotation of said shaft causes said detent pin to contact the inner surface of said body member upon cessation of said external force, thereby maintaining said coaxial spring member in compression and placing said tool in a preset condition whereby said jaw-like extensions are capable of engaging said opposed edges of said component, and whereby the subsequent rotation of said shaft permits said detent pin to reenter said narrow slot, thereby placing said tool in an active condition for extracting said component through the release of said compressive force stored by said spring member and applied to said component through said gripper members.

4. A tool as defined in claim 3 further characterized in that said means coupling said gripper means to said shaft is a generally "H" shaped support member having a central bore for accommodating a fourth shaft section, said support member being restrained by a fifth shaft section which forms a shoulder bearing against one extremity of said support member and a retainer attached to said fourth shaft section and bearing against the other extremity of said support member, said gripper members being pivotally attached to respective opposite sides of said support member within the legs of the "H", each of said gripper members having a centrally disposed tang, spring means interposed between said tang and an inner surface of said support member, said spring means tending to bias each of said jaw-like sections to a "closed" position relative to an edge of said component.

5. A tool as defined in claim 4 further including a pressure/ejection plate slidably mounted on said fourth shaft section at an extremity of the latter section farthest removed from said support member, a plurality of springs interposed between adjacent surfaces of said support member and said pressure/ejection plate, said pressure/ejection plate having on opposite sides thereof a respective pair of projecting pieces, said pieces contacting respectively the inner surfaces of said gripper members, whereby the application of said external force to said shaft enables said projecting pieces of said pressure/ejection plate to bear against the lower portions of said gripper members, thereby opening said jaw-like sections in opposition to the closing bias provided by said spring means associated with the tangs of said gripper members, said gripper members having respective shallow depressions in said inner surfaces, contact between said pressure/ejection plate and said electronic component resulting in the movement of said last mentioned plate on said fourth shaft section and the compression of the springs associated therewith, whereby said projecting pieces enter and are retained in said shallow depressions, thereby permitting said jaw-like sections to close upon the edges of said component.

6. A tool as defined in claim 5 further characterized in that said body member includes at an extremity thereof, two thin planar sections extending beyond and at right angles to the respective opposite sides thereof, said shaft having at its corresponding extremity, a rectangular plate affixed thereto, said thin planar sections of said body member and said last mentioned plate cooperating with each other to provide finger holds for the application of said external force to said shaft.

7. A tool as defined in claim 6 wherein each of said jaw-like sections includes a plurality of spaced-apart teeth positioned along its extremity for accommodating the leads of the component disposed along its edge.

8. A tool as defined in claim 7 wherein each of said side plates includes at the free extremity thereof, a pair of narrow foot-like extensions disposed at the respective corners thereof.

9. A tool as defined in claim 8 further including at least one elongated aperture in each of said gripper members disposed in proximity to said jaw-like section.

10. A tool as defined in claim 9 further including a coating of thermal insulating material disposed on the surface of said pressure/ejection plate in contact with said component.

* * * * *